United States Patent [19]

Cho

[11] 3,979,564

[45] Sept. 7, 1976

[54] 4-CHANNEL STEREO RECORDING AND REPRODUCING METHOD

[75] Inventor: Mayumi Cho, Tokyo, Japan

[73] Assignee: Pioneer Electronic Corporation, Tokyo, Japan

[22] Filed: Mar. 8, 1973

[21] Appl. No.: 339,466

[30] Foreign Application Priority Data

Mar. 9, 1972 Japan ............................ 47-24514

[52] U.S. Cl. .................. 179/100.4 ST; 179/1 GQ; 179/100.1 TD

[51] Int. Cl.² .................... G11B 3/74; H04N 5/00; H03G 3/24

[58] Field of Search ... 179/1 GQ, 15 BT, 100.1 TD, 179/100.4 ST

[56] References Cited

UNITED STATES PATENTS

| | | | |
|---|---|---|---|
| 3,686,471 | 8/1972 | Takahashi | 179/100.1 TD |
| 3,708,631 | 1/1973 | Bauer et al. | 179/100.1 TD |
| 3,745,254 | 6/1973 | Ohta et al. | 179/1 GQ |
| 3,746,792 | 7/1973 | Scheiber | 179/1 GQ |
| 3,761,628 | 9/1973 | Bauer | 179/1 GQ |
| 3,770,901 | 11/1973 | Bauer | 179/100.4 ST |
| 3,787,622 | 1/1974 | Itoh et al. | 179/1 GQ |

OTHER PUBLICATIONS

"The JVC CD–4 System" Oct. 1971 p. 46 Audio Magazine.

"Further Improvements in Discrete 4 Channel System CD–4" Owaki June 1972 vol. 20 No. 5 p. 361.

*Primary Examiner*—Alfred H. Eddleman
*Assistant Examiner*—Jay P. Lucas
*Attorney, Agent, or Firm*—Sughrue, Rothwell, Mion, Zinn and Macpeak

[57] ABSTRACT

A method for recording and reproducing a 4-channel stereo signal wherein the reproduced signal can be used with conventional discrete signal or matrix stereophonic systems. Four related audio signals are matrixed to produce a first main channel audio signal, a first sub-channel audio signal, a second main channel signal and a second sub-channel audio signal. The sub-channel signals are modulated, and the first main channel signal and the modulated first sub-channel signal are recorded on one recording surface of a record. The second main channel signal and modulated second sub-channel signal are recorded on another recording surface of the record. To reproduce the original four related audio signals, the first and second sub-channel signals are demodulated and the first main channel signal, first sub-channel signal, second main channel signal, and second sub-channel signal are matrixed to produce the four related audio signals. The matrix is arranged such that if only the main channel signals are applied to the matrix, an output compatible with a conventional matrix stereophonic system will be produced. If, however, all four signals are applied to the matrix, an output compatible with prior discrete stereo signal systems is produced.

8 Claims, 15 Drawing Figures

4-CHANNEL STEREO RECORDING AND REPRODUCING METHOD

BACKGROUND OF THE INVENTION

Field of the Invention

This invention relates to a method of recording and reproducing stereophonic signals and, in particular, to a method of recording and reproducing stereophonic signals such that the reproduced signals are compatible with prior art discrete signals or matrixed stereo systems.

DESCRIPTION OF THE PRIOR ART

In the prior art, there are primarily two types of stereo systems. In the discrete signal stereo systems, signals corresponding to the left front, right front, left back and right back are recorded on the two recording surfaces of a record. These four signals are then reproduced to provide a stereo signal. In a prior art matrix type of stereo system, two signals comprising different components of the left front, right front, left back and right back audio signals are recorded. One signal is recorded on each recording surface of the record. These two signals are reproduced and matrixed to produce a stereo signal output.

The primary disadvantage in these two prior art systems is that the signals developed in one system are incompatible with the other system. Thus, signals from a discrete system cannot be used in a matrix system, and signals from a matrix system cannot be used in a discrete system.

The method disclosed herein is compatible with matrix stereo systems such as developed by Columbia Broadcasting System Inc. of U.S.A. (which is disclosed in W. German Pat. No. 2,126,432, No. 2,139,098, No. 2,126,480 etc.) and developed by Pater Scheiber of U.S.A. (which is disclosed in U.S. Pat. No. 3,632,886, W. German Pat. No. 2,014,856 etc.) and discrete signal stereo system such as developed by Victor Co., of Japan (which is disclosed in W. German Pat. No. 2,131,756, No. 2,131,937).

SUMMARY OF THE INVENTION

It is the primary object of this invention to provide a method for recording and reproducing a four channel stereo signal in which the reproduced signal is compatible with either a matrix or discrete signal stereo system.

Four signals corresponding to the signals in a discrete stereo system are produced and these signals are matrixed prior to recording on the record. The output of the matrix is four audio components which are used to provide a first main channel signal, a first sub-channel signal, a second main channel signal, and a second sub-channel signal. The first and second sub-channel signals are modulated and then the four signals are recorded such that the first main channel and modulated first sub-channel are recorded on one recording surface of the record and the second main channel and modulated second sub-channel are recorded on the other recording surface of the record. During reproduction, the signals are detected and matrixed such that the matrix is capable of producing two components corresponding to the two components in a matrix stereo system or four components corresponding to the four components in a discrete stereo system. The outputs of the matrix are then applied to conventional discrete or matrix systems to produce a four channel stereo output.

BRIEF DESCRIPTION OF THE DRAWINGS

FIGS. 9–11 show other preferred embodiments according to the present invention respectively, in which FIG. 9 shows an example for obtaining the reproducing effect close to a discrete system by utilizing the matrix portion of the conventional reproducing device, FIG. 11 is shown for explanation of the additional device to said matrix portion so as to obtain the discrete system 4-channel stereo signals, and FIG. 10 shows an example to be utilized as the matrix system 4-channel stereo.

DETAILED DESCRIPTION OF THE INVENTION

This invention relates to a 4-channel stereo recording and the reproducing device and more particularly, to a device for reproducing a discrete system 4-channel stereo, or matrix system 4-channel stereo. The device is arranged so that records obtained by either discrete or matrix systems may be utilized as they are.

In the prior art 4-channel stereo systems, there are discrete systems where four signals are recorded independently and are reproduced, and there are matrix systems in which four signals are united into two channels by prematrixing and recording each of them in right and left side walls of a recording sound groove, respectively. The discrete system and the matrix system are independent of each other.

Figure 1A:
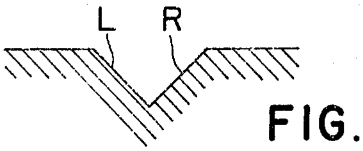
FIG. 1a PRIOR ART
FIG. 1, consisting of 1*a* through 1*c*, is shown for explaining a conventional discrete signal 4-channel stereo recording system.
Figure 1B:
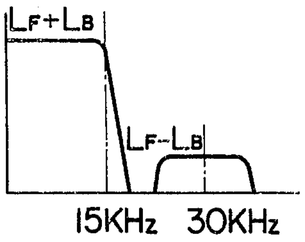
Figure 1C:
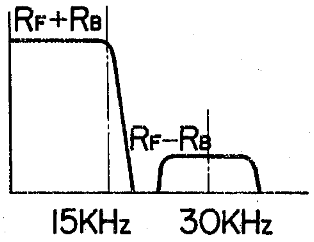

FIGS. 1*a*, 1*b* and 1*c* show the principle of a record of conventional discrete system, wherein FIG. 1*a* shows a sound groove having both of its walls inclined 45° with respect to the horizontal, that is, a sound groove, of a 45—45 system record. On one wall L of the sound groove, there are recorded a sum signal ($L_F + L_B$) of the voices to be reproduced from left-front (hereinafter to be called $L_F$) and left-back (hereinafter to be called $L_B$), and a 30 KHz carrier wave which is frequency-modulated by the difference signal ($L_F - L_B$); on the other wall R of the sound groove, there are recorded a sum signal ($R_F + R_B$) of the voices to be reproduced from right-front (hereinafter to be called $R_F$) and the right-back (hereinafter to be called $R_B$), and the 30 KHz carrier wave which is frequency-modulated by the difference signal ($R_F - R_B$). FIGS. 1*b* and 1*c* show distribution characteristics of the audio signals recorded in the opposed walls L and R of the sound groove, respectively.

In the system shown in FIG. 1, when each of the signals recorded in the right and left sound walls are reproduced as they are, $(L_F + L_B)$ and $(R_F + R_B)$ are obtained; and by demodulating the modulated waves recorded in the right and left sound walls, each of the signal compositions of $(L_F - L_B)$ and $(R_F - R_B)$ can be obtained.

Thus, the main and sub-channel signals may be represented mathematically as follows:

*a* or 1st main channel ⟶ $L_F + L_B$

*c* or 2nd main channel ⟶ $R_F + R_B$

*b* or 1st sub-channel ⟶ $L_F - L_B$

*d* or 2nd sub-channel ⟶ $R_F - R_B$.

Figure 2:
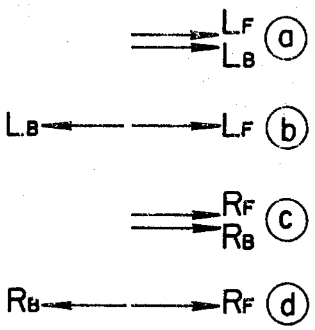
FIG. 2 PRIOR ART
FIG. 2 shows vector diagrams of FIG. 1.

Vector representations of these four signals are shown in FIG. 2. Designating the $(L_F + L_B)$, $(L_F - L_B)$, $(R_F + R_B)$ and $(R_F - R_B)$ as *a*, *b*, *c* and *d*, respectively, *a* and *b* are synthesized in phase to obtain $L_F$, *a* and *b* are synthesized in reverse phase to obtain $L_B$; similarly, *c* and *d* are synthesized in phase to obtain $R_F$, and *c* and *d* are synthesized in reverse phase to obtain $R_B$, whereby it is possible to reproduce four audio signals in the same relation existing as the time when they are recorded.

Figure 3:
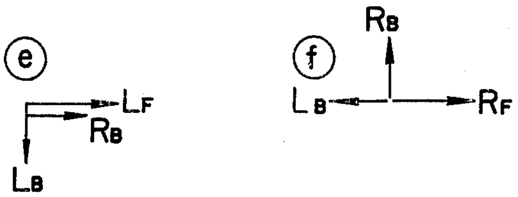
FIG. 3 PRIOR ART
FIG. 3 is a vector representation of audio signal components of a conventional matrix system stereo records.

FIG. 3 describes a system of recording obtained by a known matrix system. Two signals, each applied to one side wall of a sound groove, are shown by vector representation *e* and *f*. During reproduction, from these *e* and *f* signals, four signals *g*, *h*, *i*, *j*, as shown by vectors at the right-hand end of FIG. 4, can be obtained by using a decoder shown in FIG. 4. That is, with this decoder, the *e* signal and *f* signal are used directly as *g* and *h* signals, and at the same time the *j* signal is utilized which is obtained by adding the *e* signal and the *f* signal, which is phase shifted by −90°; the *i* signal is obtained by adding the *f* signal and the *e* signal, which is phase-shifted by −90°, and further reversing the phase of above-obtained result by 180° by a phase inverter P·I.

Each of the signals *g*, *h*, *i*, *j*, contain a large amount of signal components in left-front, right-front, left-back, right-back, as can be understood from each of their vectors, and these signals can be utilized as a matrix system 4-channel stereo having a relatively good positional sensation by reproducing them from speakers each arranged at appropriate locations.

Figure 5:
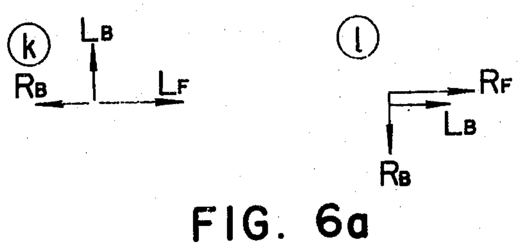
FIG. 5 shows vector diagrams of audio signal components used as sub-channels in the record according to the present invention.

The record according to the present invention as shown in FIG. 5 utilizes a recording system shown in FIG. 1, wherein the sum signal is recorded in the main channel and the difference signal in the sub-channel, but differs from the conventional system in that the characteristic feature of the invention is that the signals *e* and *f* are recorded in the main channel, and the signals *k* and *l* shown in vector representation in FIG. 5 are recorded in the sub-channel. Mathematically, signals *e*, *f*, *k*, and *l* may be represented as follows:

*e* or 1st main channel ⟶ $L_F + 0.707R_B + 0.707L_B < -90°$

*f* or 2nd main channel ⟶ $R_F + 0.707R_B < 90° - 0.707L_B$

*k* or 1st sub-channel ⟶ $L_F + 0.707L_B < 90° - 0.707R_B$

*l* or 2nd sub-channel ⟶ $R_F + 0.707L_B + 0.707R_B < -90°$

This may be accomplished, for example, by using the system shown in FIG. 2 of U.S. Pat. No. 3,686,471 to Takahashi and assigned to the Victor Company of Japan. This system is the conventional discrete 4-channel system described in FIGS. 1 and 2 of this application. However, instead of the matrix circuits 16 and 17 shown in FIG. 2 of the Takahashi patent, this invention is practiced by using the CBS matrix circuits which are employed in the conventional matrixed 4-channel system. Examples of the CBS matrix circuits are shown, for example, in FIGS. 1 and 2 of U.S. Pat. No. 3,761,628 to Bauer.

Figure 6A:
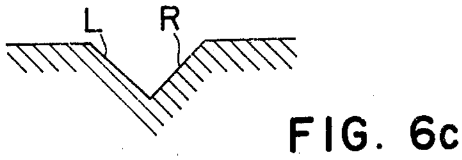
FIG. 6, consisting of 6*a* through 6*c*, is shown for explanation of distribution characteristics of synthesized signals to be recorded in the record according to the invention.
Figure 6B:
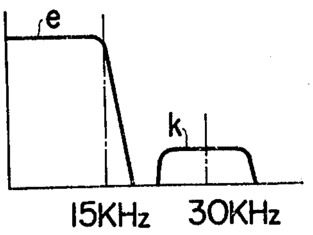
Figure 6C:
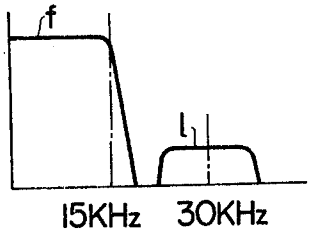

In the 4-channel stereo record according to the present invention, the *e* signal is recorded directly as the main channel in one sound wall L as shown in FIG. 6, and a 30 KHz carrier wave frequency-modulated by the *k* signal is recorded as the sub-channel. On the other sound wall R, the *f* signal is recorded directly as the main channel, and a 30 KHz carrier wave frequency modulated by the l signal is recorded as the sub-channel.

Figure 7:
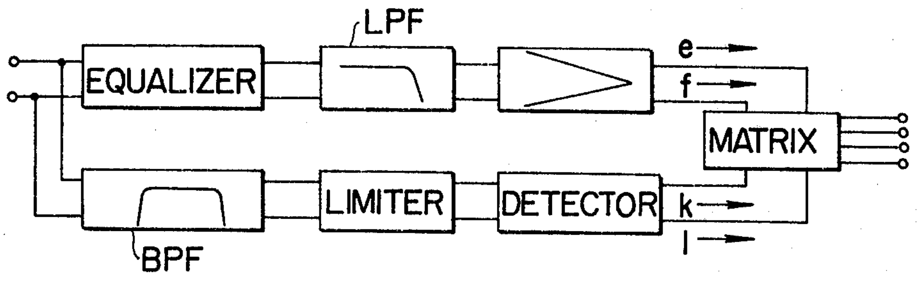
FIG. 7 is a block diagram showing an example of the reproducing device of the present invention.

FIG. 7 shows a process in a case where a record recorded as shown above is to be reproduced. Namely, a signal detected by a pick-up (not shown) is removed from the carrier wave component by a low-pass filter LPF through an equalizer circuit based upon RIAA-curve, and obtains said signals *e* and *f*. Separately taking out a modulated wave in front of the equalizer through a bandpass filter BPF, and after passing it through a limiter, and carrying out an F M detection, signals *k* and *l* are obtained, respectively.

Figure 8:
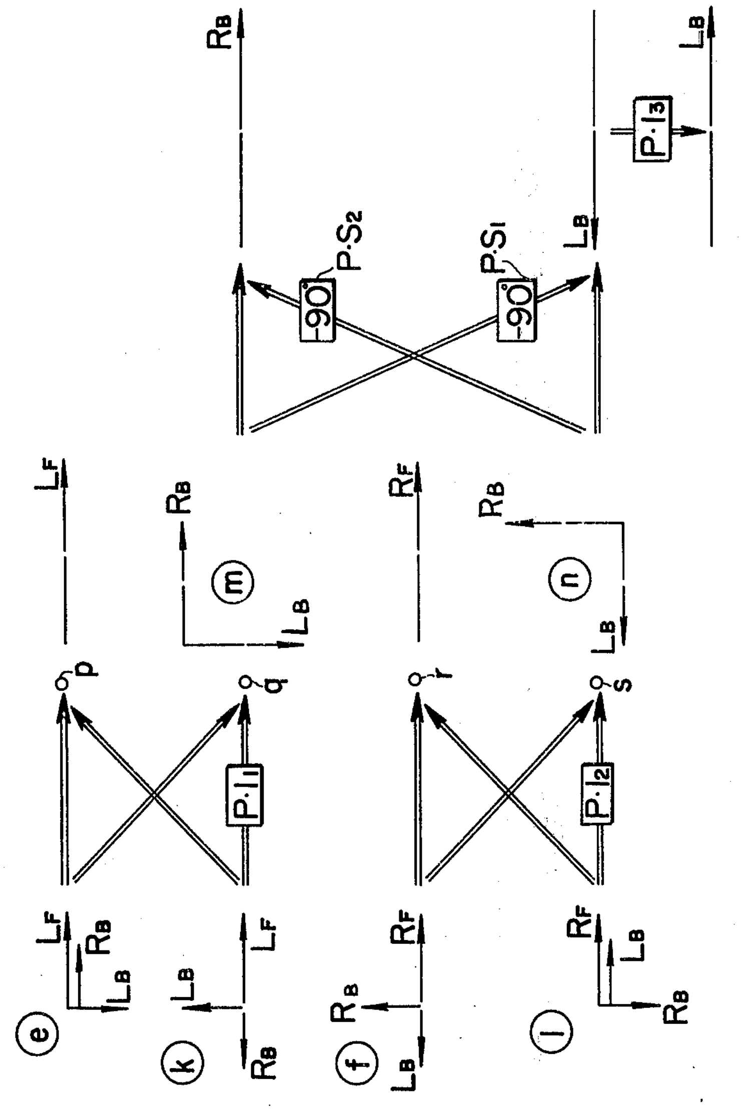
FIG. 8 illustrates the portion of matrix device used in the reproducing device, according to the present invention.

FIG. 8 shows the matrix of FIG. 7, and an explanation will be given for FIG. 8. First, by synthesizing signal *e* with signal *k*, each of the vectors $L_B$ and $R_B$ are cancelled, and the signal $L_F$ alone is taken out at a terminal *p*. Each of the vectors $L_B$ and $R_B$ are cancelled by synthesizing signals *f* and *l* in phase, and $R_F$ signal alone is taken out at a terminal *r*. Further, by reversing the phase of the signal *k* by 180° by means of a phase inverter $P \cdot I_1$, and by synthesizing it with said *e* signal, a signal designated as *m* is obtained at a terminal *q*. Similarly, by inverting the phase of l signal for 180° by means of a phase inverter $P \cdot I_2$ and by synthesizing it with said *f* signal, a signal designated as *n* is obtained at a terminal s. By shifting the phase of *n* signal −90° by means of a phase shifter $P \cdot S_2$, and by synthesizing it with said *m* signal, it is possible to obtain a signal of $R_B$ component alone, similarly by shifting the phase of said *m* signal for −90° by means of a phase shifter $P \cdot S_1$, and synthesizing it with said *n* signal, and further passing it through a phase inverter $P \cdot I_3$ the $L_B$ signal is obtained. It results in that each of the audio signals are obtained as a discrete signal as they are in the received state by means of a decoder shown in FIG. 8.

Figure 4:
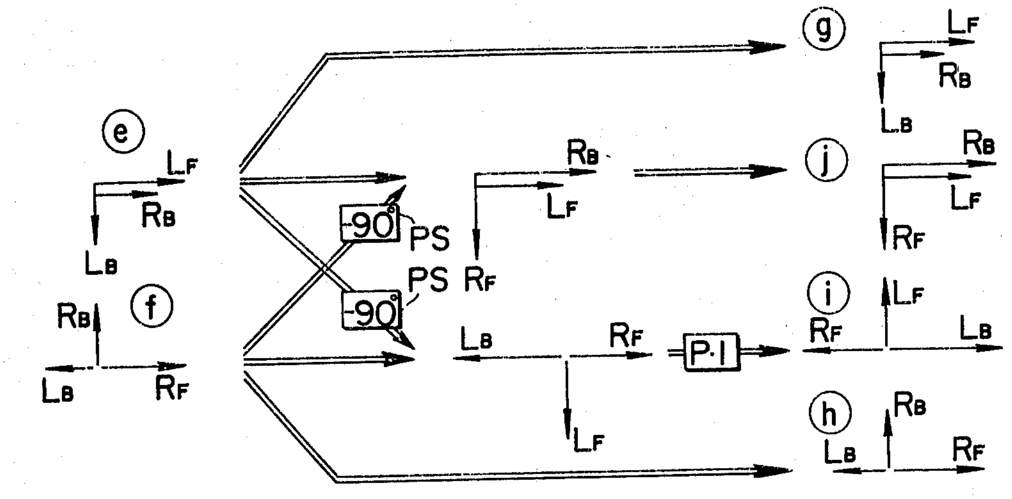
FIG. 4 PRIOR ART
FIG. 4 shows a decoder portion of the system of FIG. 3.

In the reproducing device of the present invention, the portion after the matrix circuit including two phase shifters $P \cdot S_1$, $P \cdot S_2$ and phase inverter $P \cdot I_3$, that is, after the terminals *q*, *s*, are the same as the matrix circuit shown in FIG. 4. Threfore, it is possible to obtain each of the signal components *g*, *h*, *i*, *j* which contain a large amount of audio signal components at the received state and which have comparatively good positioning sensation by applying *e* and *f* to the portion of FIG. 8 after terminals *q* and *s*.

Figure 9:
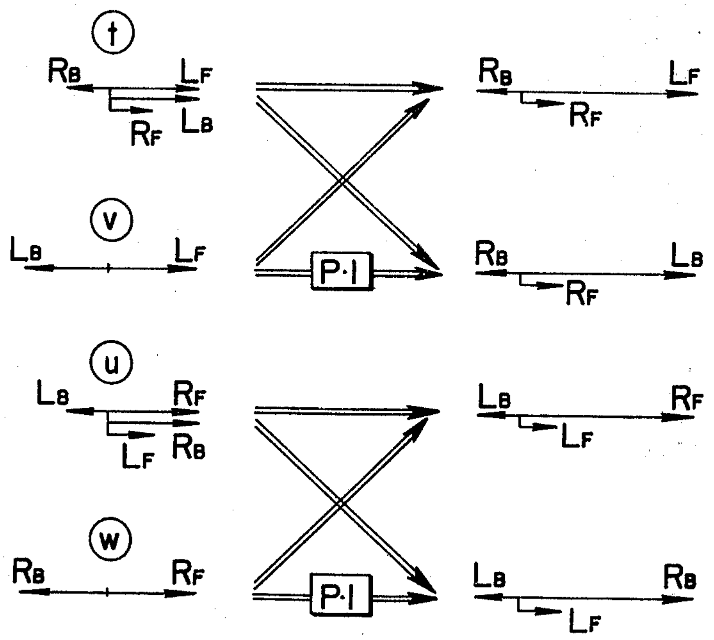

FIG. 9 shows another example of the present invention. The matrix portion shown in the drawing is the same as that shown in FIG. 8, so that the explanation of the function will be omitted. By recording synthesized signal components shown as vectors, *t*, *u*, on the left and right sides of the main channel, respectively, and recording synthesized signal components shown as *v*,

*w*, on the left and right sides of the sub-channel, respectively, it is possible to obtain each of the signals shown as vectors at the righthand end of the drawing by passing them through the matrix device. Mathematically, signals *t*, *u*, *v*, and *w* may be represented as follows:

*t* or 1st main channel $\longrightarrow L_F + L_B + 0.414R_F - 0.414R_B$

*u* or 2nd main channel $\longrightarrow R_F + R_B + 0.414L_F - 0.414L_B$

*v* or 1st sub-channel $\rightarrow L_F - L_B$

*w* or 2nd sub-channel $\rightarrow R_F - R_B$.

As can be understood from the vector diagrams, each of the signal components $L_F$, $L_B$, $R_F$, $R_B$, which are important in 4-channel stereo, are represented on a large scale, and it is possible to obtain a reproduced sound as a 4-channel stereo which is substantially near to that of a discrete system although some cross talk may be produced.

The matrix construction shown in FIG. 9 is the same as that utilized in the discrete system reproducing device described at the beginning of the specification, which is advantageously reversible. However, in the matrix construction shown in FIG. 9 there is a possibility of including cross-talk components as can be understood from the vector diagrams shown on the right-hand side of FIG. 9. This results in that it is impossible to reproduce 4-channel stereo from a discrete system without any modification, though the effect almost near that of the discrete system can be obtained.

Figure 11:
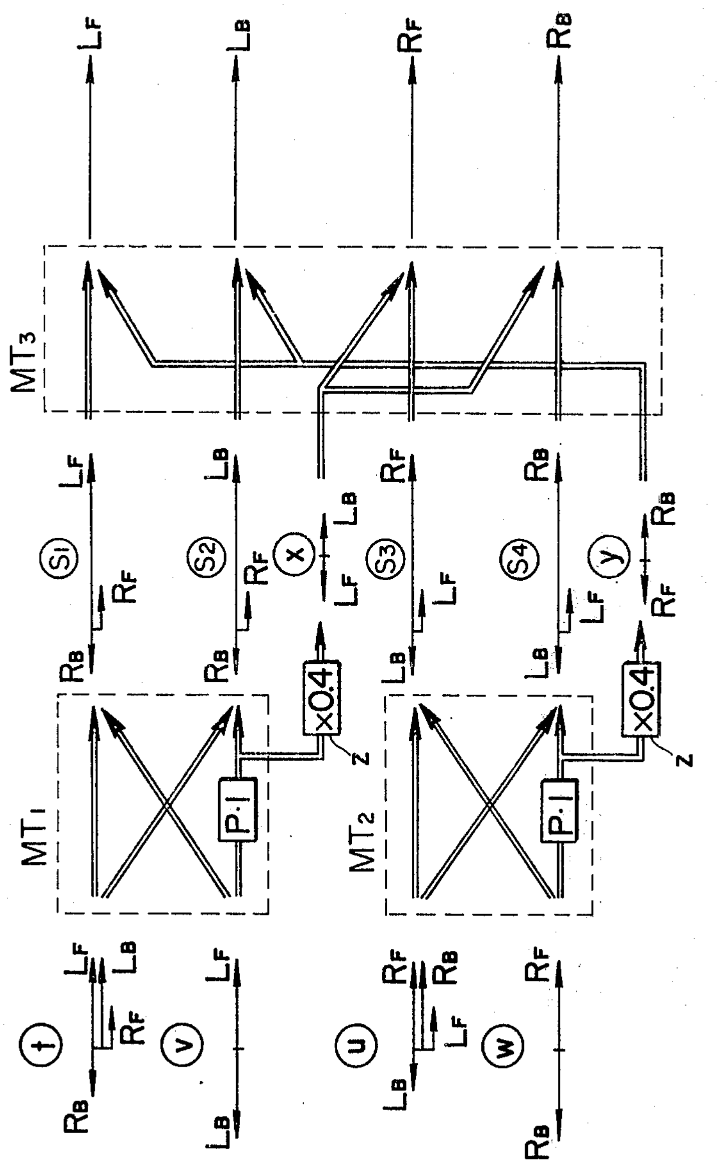

On the other hand, FIG. 11 shows a concrete example which is capable of reproducing the discrete system 4-channel stereo by providing an additional device to the matrix device in FIG. 9. That is, in FIG. 11, the left half part thereof shows the same matrix portion of FIG. 9 and *x* and *y* signals are obtained by inserting the output of the phase inverters P.I. into the attenuators *z* in order to attenuate each output about 0.4 times. Since said *x* and *y* signals are in the reverse phase of the cross-talk component contained in each signal component obtained by the aforementioned matrix, said cross-talk component is entirely cancelled by adding said *x* and *y* signals in the manner shown in the right half part of FIG. 11. As a result, the signal of the discrete system 4-channel stereo can be obtained.

More particularly, in the matrix $MT_1$ the operation is carried out which results in signals $S_1$ and $S_2$ represented mathematically as follows:

$$\begin{aligned} t + v &= (L_F + L_B + 0.414R_F - 0.414R_B) + (L_F - L_B) \\ &= 2L + \underline{0.414R_F - 0.414R_B} \qquad S_1 \\ t - v &= (L_F + L_B + 0.414R - 0.414R) - (L_F - L_B) \\ &= 2L_B + \underline{0.414R_F - 0.414R_B)} \qquad S_2 \end{aligned}$$

And in the matrix $MT_2$, the operation is carried out which results in $S_3$ and $S_4$.

$$\begin{aligned} u + w &= (R_F + R_B + 0.414L_F - 0.414L_B) + (R_F - R_B) \\ &= 2R_F + \underline{0.414L_F - 0.414L_B} \qquad S_3 \\ u - w &= (R_F + R_B + 0.414L_F - 0.414L_B) - (R_F - R_B) \\ &= 2R_B + \underline{0.414L_F - 0.414L_B} \qquad S_4 \end{aligned}$$

The underlined portions in $S_1$, $S_2$, $S_3$, and $S_4$ indicate cross talk, and this adversely effects the normality of the stereo sound image produced. Accordingly, if a component of inverse phase is added to cross talk component in the underlined portions, the cross talk can be cancelled, and thus the sense of finely separated music sources of the stereo sound image becomes quite good. Therefore, $x = 0.414L_B - 0.414L_F$ is obtained by means of the fact that the signal *v* phase-reversed is attenuated by 0.414 times ($\approx 0.4\times$). Also $y = 0.414R_B - 0.414R_F$ is obtained by means of the fact that the result obtained by phase-reversing the signal *v* is attenuated by 0.414 times. Thus, the discrete 4-channel stereo signal is obtained by performing the following operation by the last matrix $MT_3$:

$$\begin{aligned} S_1 + y &= (2L_F + 0.414R_F - 0.414R_B) + (0.414R_B - 0.414R_F) \\ &= 2L_F \\ S_2 + y &= (2L_B + 0.414R_F - 0.414R_B) + (0.414R_B - 0.414R_F) \\ &= 2L_B \\ S_3 + x &= (2R_F + 0.414L_F - 0.414L_B) + (0.414L_B - 0.414L_F) \\ &= 2R_F \\ S_4 + x &= (2R_B + 0.414L_F - 0.414L_B) + (0.414L_B - 0.414L_F) \\ &= 2R_B \end{aligned}$$

Figure 10:
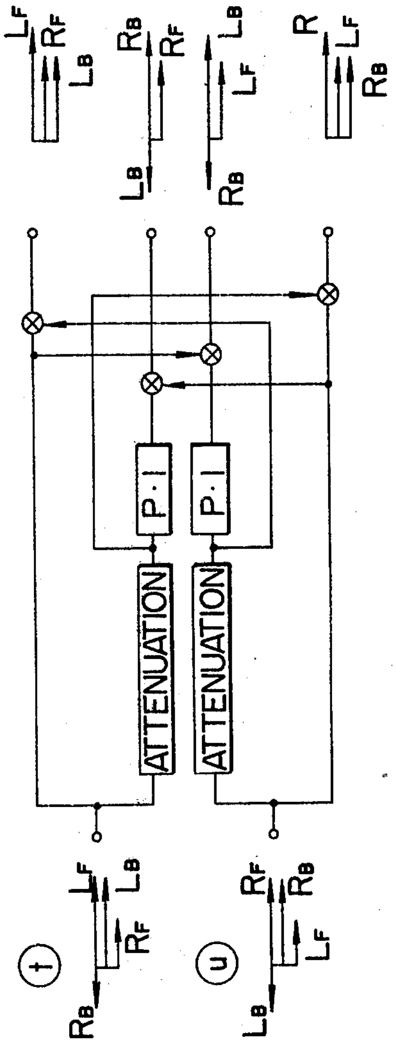

Furthermore, by adding only signals *t* and *u* which have been recorded in the main channel to a matrix device shown in FIG. 10, it is possible to obtain each of the signals as shown by vectors at the right-hand end. As is seen from each of the vectors, each of the signals $L_F$, $R_B$, $L_B$, $R_F$, are represented with a considerable weight respectively, and they can be reproduced as a matrix system 4-channel stereo although there is a possibility of producing cross-talk.

The device according to this invention, in short, provides for making right and left main channels into 2-channel signals for transmission with a matrix system, and at the same time modulating sub-carriers with sub-channel signals which can be separated by matrixing with the main channel. Thus, the system reproduces four signals, namely, right and left main channels and modulated waves of corresponding right and left sub-channels. The essential points of the invention are that with signals of the main channels alone, matrix 4-channel signals can be obtained, and by utilizing the signals of said sub-channels, signal components as discrete 4-channel signals or those near thereto are obtained.

The invention can take signal components of right and left channel and of right and left sub-channel in various forms within a range which does not depart from the spirit of the invention.

While the invention has been particularly shown and described with reference to preferred embodiments thereof, it will be understood by those skilled in the art that foregoing and other changes in form and details may be made therein without departing from the spirit and scope of the invention.

What is claimed is:

1. A method of recording and reproducing a four channel stereo signal on a record comprising:

a. generating four related audio signals;

b. matrixing said four audio signals to produce a first main channel audio signal composed of at least three of said four related audio signals in a first predetermined phase and amplitude relationship, a first sub-channel audio signal composed of at least two of said four related audio signals in a second predetermined phase and amplitude relationship, a second main channel audio signal composed of at least three of said four related audio signals in a third predetermined phase and amplitude relationship, and a second sub-channel audio signal composed of at least two of said four related audio signals in a fourth predetermined phase and amplitude relationship, c. frequency modulating a carrier wave with said first sub-channel audio signal;

d. frequency modulating a carrier wave with said second sub-channel audio signal;

e. recording said first main channel audio signal and said carrier modulated by said first sub-channel audio signal on a first recording surface of said record;

f. recording said second main channel audio signal and said carrier modulated by said second sub-channel audio signal on a second recording surface of said record;

g. reproducing said first and second main channel audio signals and said first and second sub-channel audio signals to produce four separate audio signals capable of being applied to a matrix or discrete stereophonic reproducing system for providing said four channel stereo signal.

2. The method of claim 1, wherein reproducing said first and second main channel audio signals and said first and second sub-channel audio signals includes:

a. demodulating said carrier to produce said first and second sub-channel audio signals;

b. matrixing said first main channel audio signal, said first sub-channel audio signal, said second main channel audio signal, and said second sub-channel audio signal to produce said four channel stereo signal.

3. The method of claim 1, wherein said first main channel audio signal is composed of only three of said four related audio signals and said first sub-channel audio signal is composed of the same three audio signals as said first main channel audio signal, two of said audio signals in said first sub-channel audio signal being equal in amplitude and in phase opposition to the corresponding two audio signals in said first main channel audio signal, and wherein said second main channel audio signal is composed of a different combination of three audio signals and said second sub-channel audio signal is composed of the same three audio signals as said second main channel audio signal, two of said audio signals in said second sub-channel audio signal being equal in amplitude and in phase opposition to the corresponding two audio signals in said second main channel audio signal.

4. The method of claim 3, wherein reproducing said first and second main channel audio signals and said first and second sub-channel audio signals includes:

a. demodulating said carrier to produce said first and second sub-channel audio signals;

b. matrixing said first main channel audio signal with said first sub-channel audio signal to produce one of said four related audio signals and a first composite signal composed of the remaining two of the three audio signals of said first main channel and first sub-channel audio signals, and c. matrixing said second main channel audio signal with said second sub-channel audio signal to produce a second one of said four related audio signals and a second composite signal composed of the remaining two of the three audio signals of said second main channel and second sub-channel audio signals.

5. The method of claim 4, wherein the step of reproducing further includes matrixing said first and second composite signals to produce the third and fourth of said four related audio signals.

6. The method of claim 1, wherein said first main channel audio signal is composed of all four of said four related audio signals and said first sub-channel audio signal is composed of only two of said four related audio signals, one of said audio signals in said first sub-channel audio signal being equal in amplitude and in phase opposition to the corresponding audio signal in said first main channel audio signal, and wherein said second main channel audio signal is composed of all four of said four related audio signals and said second sub-channel audio signal is composed of a different two audio signals than said first sub-channel audio signal, one of said audio signals in said second sub-channel audio signal being equal in amplitude and in phase opposition to the corresponding audio signal in said second main channel audio signal.

7. The method of claim 6, wherein reproducing said first and second main channel audio signals and said first and second sub-channel audio signals includes:

a. demodulating said carrier to produce said first and second sub-channel audio signals;

b. matrixing said first main channel audio signal with said first sub-channel audio signal to produce first and second composite signals, and c. matrixing said second main channel audio signal with said second sub-channel audio signal to produce third and fourth composite signals, each of said four related audio signals being substantially dominant in respective ones of said composite signals.

8. The method of claim 7, wherein the step of reproducing further includes:

a. matrixing said first and second composite signals with said second sub-channel audio signal to produce two of said four related audio signals, and b. matrixing said third and fourth composite signals with said first sub-channel audio signal to produce the other two of said four related audio signals.

* * * * *